(12) United States Patent
Imai et al.

(10) Patent No.: US 7,676,913 B2
(45) Date of Patent: Mar. 16, 2010

(54) WIRING BOARD, METHOD OF MANUFACTURING WIRING BOARD, AND ELECTRONIC DEVICE

(75) Inventors: Hideo Imai, Suwa (JP); Kazuaki Sakurada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 92 days.

(21) Appl. No.: 12/016,826

(22) Filed: Jan. 18, 2008

(65) Prior Publication Data
US 2008/0115351 A1 May 22, 2008

Related U.S. Application Data

(62) Division of application No. 11/156,586, filed on Jun. 21, 2005, now abandoned.

(30) Foreign Application Priority Data
Jul. 8, 2004 (JP) .............................. 2004-201882

(51) Int. Cl.
*H05K 3/30* (2006.01)
(52) U.S. Cl. .............................. 29/832; 29/829; 29/831; 29/846; 174/250; 427/97.1; 427/256
(58) Field of Classification Search .................. 29/830, 29/831, 832, 846; 427/97.1, 97.3, 98.4, 256; 174/250, 255, 257, 260
See application file for complete search history.

(56) References Cited
U.S. PATENT DOCUMENTS
6,378,199 B1 4/2002 Yoshinuma et al.
6,465,742 B1 10/2002 Hiraoka et al.
6,661,563 B2 12/2003 Hayashi et al.
6,787,984 B2 * 9/2004 Watanabe et al. ........... 313/495
6,822,289 B2 11/2004 Kozuka et al.
6,887,650 B2 5/2005 Shimoda et al.
2004/0022933 A1 * 2/2004 Tomida et al. ................. 427/78
2004/0129921 A1 7/2004 Endo et al.
2004/0145858 A1 * 7/2004 Sakurada ..................... 361/600
2005/0006339 A1 * 1/2005 Mardilovich et al. .......... 216/39
2005/0026314 A1 2/2005 Yamaguchi FOREIGN PATENT DOCUMENTS
| JP | 09-023063 A | 1/1997 |
| JP | 11-163499 A | 6/1999 |
| JP | 2003-037363 A | 2/2003 |
| JP | 2003-324202 A | 11/2003 |
| JP | 2004-186668 A | 7/2004 |

* cited by examiner

*Primary Examiner*—Derris H Banks
*Assistant Examiner*—Jeffrey Carley
(74) *Attorney, Agent, or Firm*—Global IP Counselors, LLP

(57) ABSTRACT

A method of manufacturing a wiring board includes steps of: providing a substrate; forming a first wiring layer on the substrate by photolithography; forming a first insulating layer by ink jetting so as to cover a part of the first wiring layer and expose an exposed section of the first wiring layer; and forming a second wiring layer by ink jetting partly over the first wiring layer, with the first insulating layer being between the part of the first wiring layer and a part of the second wiring layer. A wider variety of conductive material and insulating material can be used for forming the wiring layers and the insulating layers on the substrate by ink jetting, while the wiring board has a first wiring layer having high density.

5 Claims, 10 Drawing Sheets

WIRING BOARD, METHOD OF MANUFACTURING WIRING BOARD, AND ELECTRONIC DEVICE

CROSS-REFERENCE TO RELATED APPLICATIONS

This application is a divisional application of U.S. patent application Ser. No. 11/156,586 filed on Jun. 21, 2005, which claims priority to Japanese Patent Application No. JP2004-201882 filed on Jul. 8, 2004. The entire disclosures of U.S. patent application Ser. No. 11/156,586 and Japanese Patent Application No. JP2004-201882 are hereby incorporated herein by reference.

BACKGROUND OF THE INVENTION

1. Field of the Invention

The present invention relates to a wiring board having a wiring layer formed in multiple layers, a method of manufacturing such wiring board, and an electronic device having such wiring board.

2. Background Information

Conventionally, wiring boards are manufactured by forming a wiring layer and an insulating layer simultaneously on the surface of a substrate. First, droplets of both a conductive material for forming the wiring layer and an insulating material for forming the insulating layer are deposited onto the surface of the substrate by ink jetting. Then, the wiring layer and the insulating layer are formed simultaneously on the surface of the substrate as one layer. Thereafter, another layer of a wiring layer and an insulating layer is formed by similar methods on top of the layer already formed. Thus, a wiring board having multiple layers of the wiring layer is obtained. The wiring layers are electrically conductive relative to each other. Japanese Patent Application Publication No. 11-163499 discloses an example of such wiring board.

In other words, the conventional technique entails forming the wiring layer and the insulating layer simultaneously as one layer by ink jetting, and curing the layer by heating or the like. Consequently, it is difficult to use the two materials together when the heating temperatures at which the conductive material and the insulating material are deposited onto the surface of the substrate are different, or when the curing methods for the two materials, such as with heating and ultraviolet ray irradiation, for example, are different. Also, the wiring layer and the insulating layer formed by ink jetting do not have a high density, unlike the high-density wiring boards formed by conventional additive methods or the like.

In view of the above, it will be apparent to those skilled in the art from this disclosure that there exists a need for improved wiring board, method of manufacturing wiring board, and electronic device having such wiring board that overcome the problems of the conventional art. This invention addresses this need in the art as well as other needs, which will become apparent to those skilled in the art from this disclosure.

SUMMARY OF THE INVENTION

An object of the present invention is to provide a wiring board, a method of manufacturing a wiring board, and an electronic device having such wiring board, wherein a wider variety of conductive material and insulating material can be used for forming the wiring layers and the insulating layers on the substrate by ink jetting, while the wiring board can have a first wiring layer having high density.

The wiring board according to the first aspect of the present invention has a substrate, a first wiring layer formed on the substrate by photolithography, a first insulating layer formed by ink jetting so as to cover at least a part of the first wiring layer, and a second wiring layer formed by ink jetting partly over the first wiring layer, with the first insulating layer being between the part of the first wiring layer and a part of the second wiring layer.

The method of manufacturing a wiring board according to another aspect of the present invention includes steps of: providing a substrate; forming a first wiring layer on the substrate by photolithography; forming a first insulating layer by ink jetting so as to cover a part of the first wiring layer and expose an exposed section of the first wiring layer; and forming a second wiring layer by ink jetting partly over the first wiring layer, with the first insulating layer being between the part of the first wiring layer and a part of the second wiring layer.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
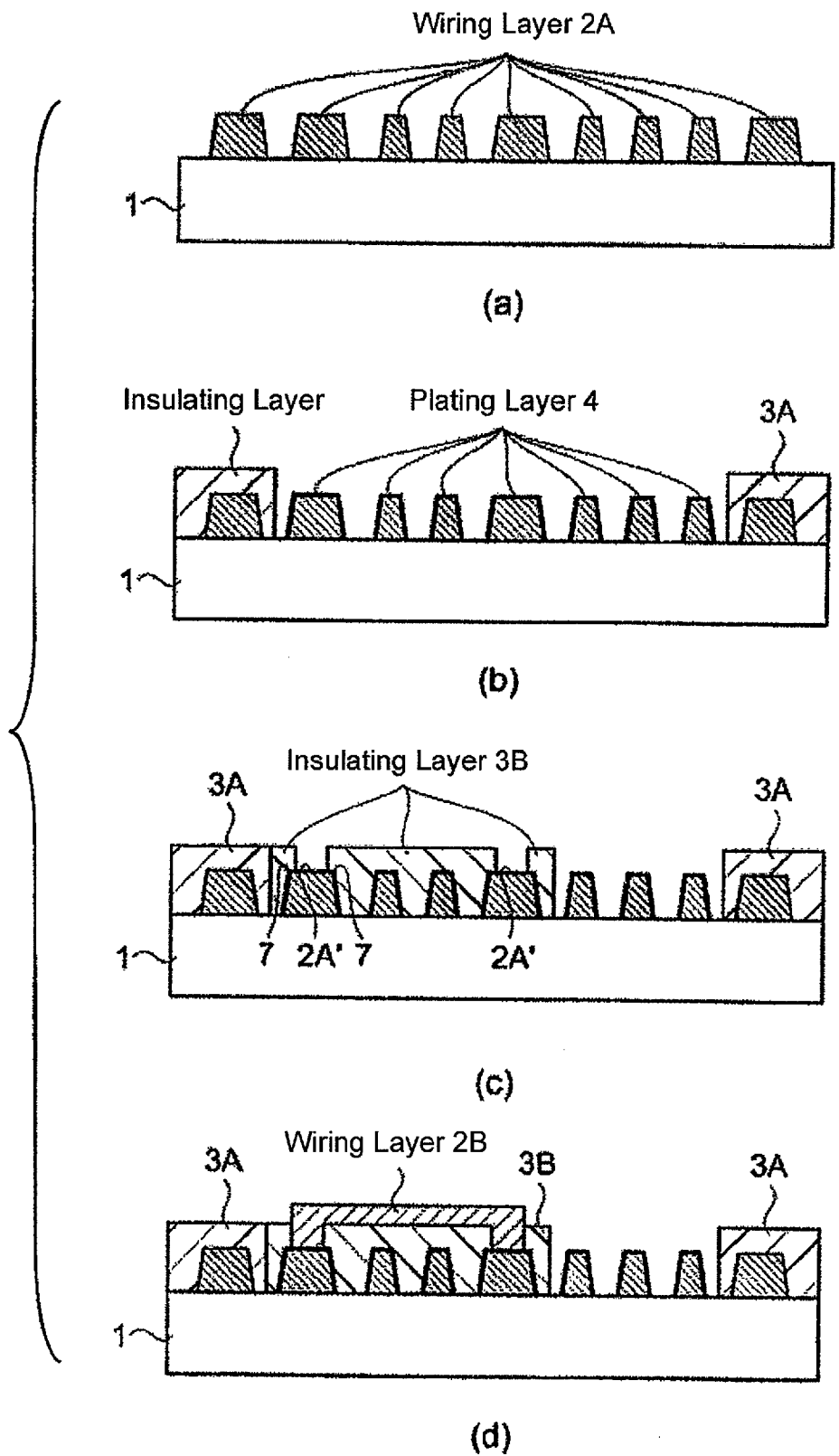
FIG. 1(*a*)-(*d*) are schematic cross-sectional views illustrating the first half of the method of manufacturing the wiring board according to the first embodiment of the present invention.

The wiring board according to the first aspect of the present invention has a substrate, a first wiring layer formed on the substrate by photolithography, a first insulating layer formed by ink jetting so as to cover at least a part of the first wiring layer, and a second wiring layer formed by ink jetting partly over the first wiring layer, with the first insulating layer being between the part of the first wiring layer and a part of the second wiring layer.

In this wiring board, a second wiring layer formed by ink jetting is formed in an overlapped fashion over the first wiring layer that is formed by photolithography. A first insulating layer is provided between the first and the second wiring layers. The insulating layer is provided only where the second wiring layer is to be formed. Therefore, no material is wasted and the amount of material used can be reduced. Also, since the first insulating layer and the second wiring layer are formed by ink jetting in an overlapped fashion over the high-density first wiring layer formed by photolithography, a wiring board is obtained with better precision than when the insulating layers and the wiring layers are formed by the inkjet method alone.

In this case, the wiring board preferably further includes a second insulating layer formed by ink jetting so as to cover at least a part of the second wiring layer; and a third wiring layer formed by ink jetting partly over the second wiring layer, with the second insulating layer being between the part of the second wiring layer and a part of the third wiring layer.

According to this configuration, a second insulating layer and a third wiring layer are further formed in an overlapped fashion over the second wiring layer, whereby a wiring board having a multiple wiring layers is obtained. By using the inkjet method, the wiring layer and the insulating layer can easily be formed selectively in any necessary sections. Also, there is no need to perform a masking step, an unmasking step, and a plating step, nor is there need for any equipment to perform these steps. Thus, there are fewer manufacturing steps to be performed. Accordingly, the manufacturing costs can be reduced.

In this case, it is preferable that the first wiring layer has an exposed section that is not covered by the first insulating layer, the second wiring layer has an exposed section that is not covered by the second insulating layer, and the third wiring layer has an exposed section that is not covered by the first or the second insulating layer. Furthermore, it is preferable that the second and the third wiring layers are respectively connected to the exposed sections of the first and the second wiring layers and made electrically conductive therewith. Still furthermore, an electronic component can be mounted on at least one of the exposed sections of the first, second, and the third wiring layers.

According to this configuration, the wiring layers formed into multiple layers are electrically conductive with one another. Furthermore, the substrate can have various functions with an electronic component mounted thereon, even when the substrate has a small planar surface area.

Furthermore, in the wiring board according to the present invention, the exposed section can be encircled by the first insulating layer. Still furthermore, the substrate can be a flexible substrate.

The method of manufacturing a wiring board according to another aspect of the present invention includes steps of: providing a substrate; forming a first wiring layer on the substrate by photolithography; forming a first insulating layer by ink jetting so as to cover a part of the first wiring layer and expose an exposed section of the first wiring layer; and forming a second wiring layer by ink jetting partly over the first wiring layer, with the first insulating layer being between the part of the first wiring layer and a part of the second wiring layer.

According to this method for manufacturing a wiring board, a second wiring layer is formed in an overlapped fashion over the first wiring layer. A first insulating layer is provided between the first and second wiring layers. The first insulating layer is provided only to the sections where the second wiring layer is to be formed. Therefore, relatively less material is wasted, and the amount of material to be used can be reduced. Also, since the first insulating layer and the second wiring layer are formed by ink jetting in an overlapped fashion on the high-density first wiring layer that is formed by photolithography, a wiring board having a better precision than one whose insulating layers and wiring layers are formed with the inkjet method alone.

In this case, it is preferable that the manufacturing method further includes steps of: forming a second insulating layer by ink jetting so as to cover at least a part of the second wiring layer and expose an exposed section of the second wiring layer; and a third wiring layer formed by ink jetting partly over the second wiring layer, with the second insulating layer being between the part of the second wiring layer and a part of the third wiring layer.

According to this configuration, a second insulating layer and a third wiring layer are further formed in an overlapped fashion over the second wiring layer, whereby a wiring board having multiple wiring layers is obtained. Using the inkjet method, the wiring layer and the insulating layer can be easily formed selectively in any necessary sections. Also, there is no need to perform a masking step, an unmasking step, and a plating step, nor is there need for any equipment to perform these steps. Thus, there are fewer manufacturing steps to be performed. Accordingly, the manufacturing costs can be reduced.

In the step of forming the first insulating layer of the manufacturing method of the present invention, the exposed section is formed by depositing an insulating material so as to avoid the exposed section, encircling the exposed section with the first insulating layer.

In this case, the exposed sections are avoided and the first insulating layer is formed so that the exposed sections of the first wiring layer are not covered by the first insulating layer. The exposed sections are formed in the area in which the first insulating layer forms a concavity. Using the ink jetting method, the first insulating layer can be easily formed avoiding the exposed sections.

In the method for manufacturing a wiring board of the present invention, the step of forming the first insulating layer includes steps of forming a first-tier insulating layer by ink jetting so that an upper surface of the first-tier insulating layer is on the same level with an upper surface of the first wiring layer, and forming a second-tier insulating layer by ink jetting so as to cover at least a part of the first wiring layer and the first-tier insulating layer, so that the second-tier insulating layer is between the second wiring layer and the first wiring layer or the first-tier insulating layer.

According to this method of manufacturing a wiring board, the second wiring layer is formed in an overlapped fashion over the first wiring layer. The first insulating layer is provided across the first and second wiring layers. This first insulating layer is formed divided in two layers. The first-tier insulating layer is formed up to the upper surface of the first wiring layer. Therefore, the portion of the first wiring layer that lies on the same plane as the first-tier insulating layer is not covered by the first-tier insulating layer, and therefore is exposed. Next, a second-tier insulating layer is formed so as to cover the first wiring layer and the first-tier insulating layer between the exposed sections connected by forming the second wiring layer. The second-tier insulating layer can be formed more easily than when the second layer is formed so as to encircle the periphery of the exposed sections. Also, relatively little material is wasted and the amount of material to be used can be reduced. Furthermore, since the first-tier and the second-tier insulating layers and the second wiring layer are formed by ink jetting in an overlapped fashion on the high-density first wiring layer that is formed by photolithography, a wiring board having a better precision can be obtained than when the insulating layers and the wiring layers of the wiring board are formed only by ink jetting.

In this case, it is preferable that the manufacturing method further includes steps of: forming a second insulating layer by ink jetting so as to cover at least a part of the second wiring layer and expose an exposed section of the second wiring layer; and a third wiring layer formed by ink jetting partly over the second wiring layer, with the second insulating layer being between the part of the second wiring layer and a part of the third wiring layer.

According to this configuration, a second insulating layer and a third wiring layer are further formed in an overlapped fashion over the second wiring layer, whereby a wiring board having multiple wiring layers is obtained. Using the inkjet method, the wiring layer and the insulating layer can be easily formed selectively in any necessary sections. Also, there is no need to perform a masking step, an unmasking step, and a plating step, nor is there need for any equipment to perform these steps. Thus, there are fewer manufacturing steps to be performed. Accordingly, the manufacturing costs can be reduced.

In this case, it is preferable that in the step of forming the wiring layer, the wiring layer formed in an overlapped fashion is connected to the exposed sections and made electrically conductive therewith. Furthermore, a manufacturing method can include a step of mounting an electronic component on at least one of the exposed sections of first, second, and the wiring layers.

According to this configuration, the wiring layer formed in multiple layers is configured so as to be electrically conductive. Furthermore, the substrate can have various functions with an electronic component mounted thereon, even when the substrate has a small planar surface area.

In the step of forming the second-tier insulating layer, the second-tier insulating layer can be formed only on sides of the exposed section along which the second wiring layer extends across the first-tier insulating layer and the first wiring layer.

In this arrangement, the second-tier insulating layer is provided to the exposed sections only on the sides on which the second wiring layer extends. The second-tier insulating layer can be formed more easily than when the second layer is formed so as to encircle the periphery of the exposed sections. Also, relatively little material is wasted and the amount of material to be used can be reduced. Furthermore, since the first-tier and the second-tier insulating layers and the second wiring layer are formed by ink jetting in an overlapped fashion on the high-density first wiring layer that is formed by photolithography, a wiring board having a better precision can be obtained than when the insulating layers and the wiring layers of the wiring board are formed only by ink jetting.

The electro-optical device of the present invention is provided with the wiring board manufactured according to the method of manufacturing a wiring board discussed above The electronic device of the present invention is provided with the electro-optical device.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

The wiring board, the method for manufacturing the wiring board, the electro-optical device having the wiring board, and the electronic device of the present invention are described below with reference to the accompanying diagrams. The wiring board discussed herein forms a pattern on the surface of a substrate with conductive material, while this pattern is used as a wiring layer to carry out the function of connecting electronic components or the like. In this case, a plurality of wiring layers are formed in an overlapped fashion on the substrate surface, and are electrically conductive with each other.

First Embodiment

Figure 2:
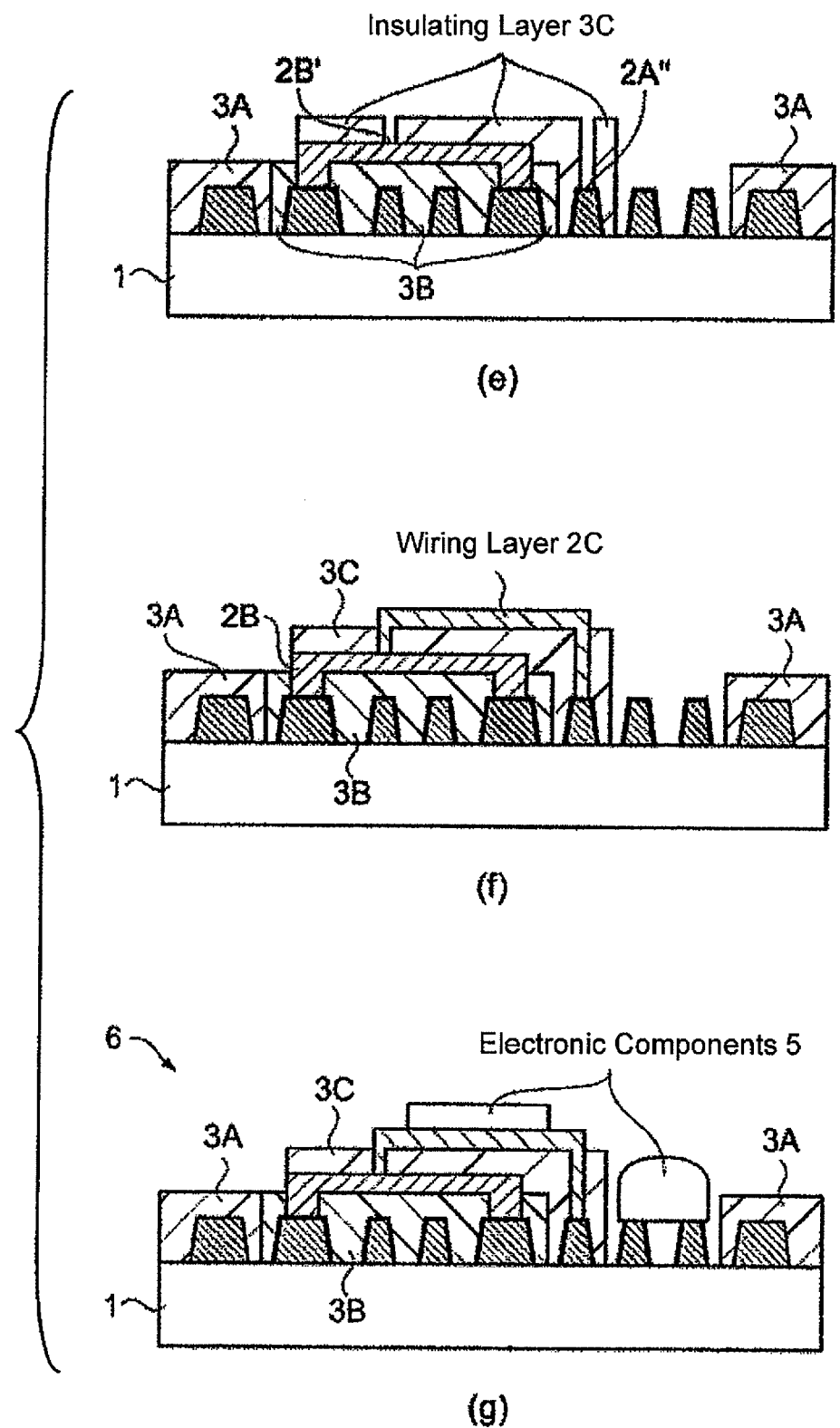
FIG. 2(*e*)-(*g*) are schematic cross-sectional views illustrating the second half of the method of manufacturing the wiring board according to the first embodiment of the present invention.

FIGS. 1 and 2 are cross-sectional views showing the sequence of the method of manufacturing a wiring board having wiring layers 2. FIG. 1 shows the method of forming a wiring layer 2A (first wiring layer) and a wiring layer 2B (second wiring layer), and FIG. 2 shows the method of forming still another wiring layer 2C over the wiring layer 2B. The wiring layer 2A is a high-density wiring layer formed by conventional additive method. The wiring layer 2B and subsequently formed layers are formed by ink jetting in an overlapping fashion partially over the wiring layer 2A. The wiring layer 2A formed by the additive method can have a precision whereby a pattern pitch can be as small as about 40 μm.

In contrast, the wiring layers 2B and the 2C are formed by an ink jetting method in which a pattern is formed by depositing conductive material as droplets. A far as the pitch patterns are concerned, a resolution of about 200 dpi and the pitch of about 120 μm are achieved with the ink jetting method. The wiring board of the present invention is obtained by efficiently combining a method of manufacturing a high-density wiring layer and a method for manufacturing a wiring layer by ink jetting.

The wiring layers 2 of the present invention is formed by first forming a wiring layer 2A, which is a conductive pattern, with the additive method on the surface of a flexible substrate 1, which is formed of polyimide, as shown in FIG. 1(a). The wiring layer 2A is formed from Cu (copper), has a fine pattern, and is conductive. Next, an insulating layer 3A made of an epoxy resin is formed as shown in FIG. 1(b) by photolithography on the wiring layer 2A except where other electronic components or wiring layers to be subsequently formed are to be connected. Ni and Au are then applied by electroplating to the exposed sections of the wiring layer 2A not covered by the insulating layer 3A, thereby forming a plating layer 4. This plating increases the strength of the wiring layer 2A, improves the conductivity with the other wiring layer, and allows easier soldering.

The additive method of forming the high-density wiring layer 2A will now be described briefly. The additive method involves a first masking, in which portions of the surface of the flexible substrate 1 other than pattern-forming portions are masked with a resist by photolithography. Next, Cu is applied by electroless plating to the pattern-forming portions which are not masked with the resist. The electroless plating is a method wherein the flexible substrate 1 masked with the resist is immersed in a mixed aqueous solution of a Cu metal salt and a reducing agent, and the Cu is reduced and precipitated onto the patterned section. When the resist is then peeled off, a pattern of the Cu is formed on the surface of the substrate 1. This pattern is the wiring layer 2A. The electroless plating can be applied not only to Cu but also to other metals that are capable of forming metal salts. It is possible to form the wiring layers 2A not only with the additive method but also with subtractive methods or other such methods.

Next, the wiring layer 2B is formed in an overlapped fashion over the high-density wiring layer 2A that is formed by the additive method. Before the wiring layer 2B is formed, an insulating layer 3B is formed so as to cover the wiring layer 2A leaving contact sections 2A' (exposed sections) of the wiring layer 2A exposed, as shown in FIG. 1(*c*). Thus, the insulating layer 3B is formed between part of the first wiring layer 2A and the second wiring layer 2B. The contact sections 2A' are to be connected with the wiring layer 2B. The insulating layer 3B, as well as the insulating layer 3A, is made of an epoxy resin. The insulating layer 3B is formed, by depositing a liquid epoxy resin as droplets by ink jetting, partly where the wiring layer 2B will be later formed over the wiring layer 2A in an overlapped fashion. At this time, the insulating layer 3A and the insulating layer 3B may be formed simultaneously by ink jetting.

The method of forming the insulating layer 3B by ink jetting leaving the contact sections 2A' of the wiring layer 2A exposed will now be described briefly. First, an insulating material is deposited onto both ends 7 of the contact sections 2A' shown in FIG. 1(*c*) so as to expose the contact sections 2A'. The insulting material is then further deposited so as to avoid the contact sections 2A', using the insulating material initially deposited on the ends 7 as a boundary. In this manner, the insulating layer 3B is formed. In other words, the contact sections 2A' are depressed concavities surrounded by the insulating layers 3B. The insulating layer 3B is cured by heat treatment after being deposited by the ink jetting.

After the insulating layer 3B is formed, the wiring layer 2B that connects the two contact sections 2A' of the wiring layer 2A is formed by ink jetting, as shown in FIG. 1(*d*). The wiring layer 2B is formed by depositing a conductive material in liquid form as droplets by ink jetting. After the wiring layer 2B is deposited, the deposited conductive material is baked by heating.

The conductive material is composed of a dispersion medium and Ag (silver) particles having an average particle diameter of about 10 nm. The Ag particles are dispersed stably in the dispersion medium. The type of dispersion medium is not particularly limited to any particular type as long as it is capable of dispersing Ag particles and does not cause aggregation. Known examples of such dispersion media include amines, alcohols, thiols, and the like. More specific examples include 2-methyl aminoethanol, diethanolamine, diethylmethylamine, 2-dimethylamino ethanol, methyl diethanolamine, and other such amine compounds, as well as alkylamines, ethylenediamine, alkyl alcohols, ethylene glycol, propylene glycol, alkyl thiols, and ethane dithiol.

These dispersion media are evaporated by heating, such that the wiring layer 2B of Ag is left behind after the baking. The contact sections 2A' are subjected to Ni and Au plating, and the wiring layer 2B of Ag is directly connected to the wiring layer 2A, which is made of still another material Cu. In this manner, the connective strength and conductivity are improved.

Next, a wiring layer 2C that connects with the wiring layer 2B and the wiring layer 2A is formed in an overlapped fashion over the wiring layer 2B. As shown in FIG. 2(*e*), an insulating layer 3C is formed, leaving contact sections 2B' (exposed sections), which are to be connected with the wiring layer 2C and the contact sections 2A" (exposed sections) of the wiring layer 2A, exposed on the wiring layer 2B. The insulating layer 3C, as well as the insulating layer 3B, is made of an epoxy resin. Also, the insulating layer 3C is formed by depositing a liquid epoxy resin by ink jetting, selectively only on portions that necessary to form the wiring layer 2C. After being deposited, the insulating layer 3C is cured by heat treatment.

After the insulating layer 3C is formed, the wiring layer 2C that connects the two contact sections 2B' and 2A" is formed, as shown in FIG. 2(*f*). The wiring layer 2C is formed by depositing a conductive material in liquid form by ink jetting, and baking the deposited conductive material by heating, as in the case of the wiring layer 2B. The wiring layer 2B and the wiring layer 2C are both wiring layers of Ag, and do not need plating to improve conductivity. The wiring layer 2B and the wiring layer 2C formed by the ink jetting form dot shaped linear patterns, which are characteristic of the ink jetting method.

Thus, the three wiring layers 2A, 2B, and 2C are formed on the surface of the substrate 1. It is possible to form a layered wiring that includes even more by repeating the steps shown in FIGS. 2(*e*) and 2(*f*). Also, electronic components 5 can be mounted on the wiring layers 2A and 2C as shown in FIG. 2(*g*). A wiring board 6 provided with a layered wiring 2 of multiple layers and electronic components 5 mounted thereon is thus obtained. The soldering capacity and the conductivity of the electronic components 5 can be further improved if the wiring layer 2C formed by ink jetting is coated with Ni and Au by a surface treatment such as plating before the electronic components 5 are mounted.

The method of manufacturing the wiring board 6 having the three wiring layers 2A, 2B, and 2C is described above. The effects of the method of manufacturing the wiring board will now be summarized.

(1) Since the layered wiring 2 can be formed by ink jetting multiple layers in an overlapped fashion over the high-density wiring layer 2A, which is formed by the additive method, the layered wiring can have better precision than a layered wiring that is formed only by ink jetting.

(2) Where the wiring layers 2B and 2C and the insulating layers 3B and 3C are formed by ink jetting, liquid materials can be deposited onto only necessary sections. Accordingly, little material is wasted.

(3) By forming the wiring layers 2B and 2C and the insulating layers 3B and 3C into multiple layers, it is possible to obtain a compact wiring board 6. Particularly, it is possible to reduce the size of the wiring board in the planar dimensions.

(4) The upper layers of the layered wiring 2 and the insulating layer 3 are formed in separate ink jetting steps on the surface of the flexible substrate 1, and are subjected to heat treatment at different times. Therefore, the conductive material and the insulating material for forming the layered wiring 2 and the insulating layer 3 may have different heating temperatures, for example. Accordingly, a greater latitude is afforded in the selection of the combination of materials for the layered wiring and the insulating layer.

(5) By forming the insulating layer 3 and the upper layers of the layered wiring 2 by ink jetting, it is possible to form the layered wiring 2 in multiple layers without using mask printing, peeling, electroless plating, and other such steps that require use of a resist. Therefore, the manufacturing process can be shortened.

Second Embodiment

Next, another method of forming the layered wiring 2 will be described. The difference between the methods of the first and the second embodiments is in the use of the method of forming the insulating layer 3B shown in FIG. 1(*c*). The insulating layer 3B of the first embodiment is depressed into a concavity such that the insulating layer 3B encircles the contact sections 2A' and exposes the contact sections 2A'. When the insulating material is deposited by ink jetting, the concavity must be formed by controlling the depositing so that the insulating material is not applied to the contact sections 2A'. In this case, when non-uniformities occur in the formation of the concavity, the concavity collapses inward and the surface area of the contact sections 2A' tends to decrease. In this state, it is difficult to form the wiring layer 2B for connecting the contact sections 2A'. In the second embodiment, such non-uniformities are less likely to be caused during the ink jetting.

Figure 3:
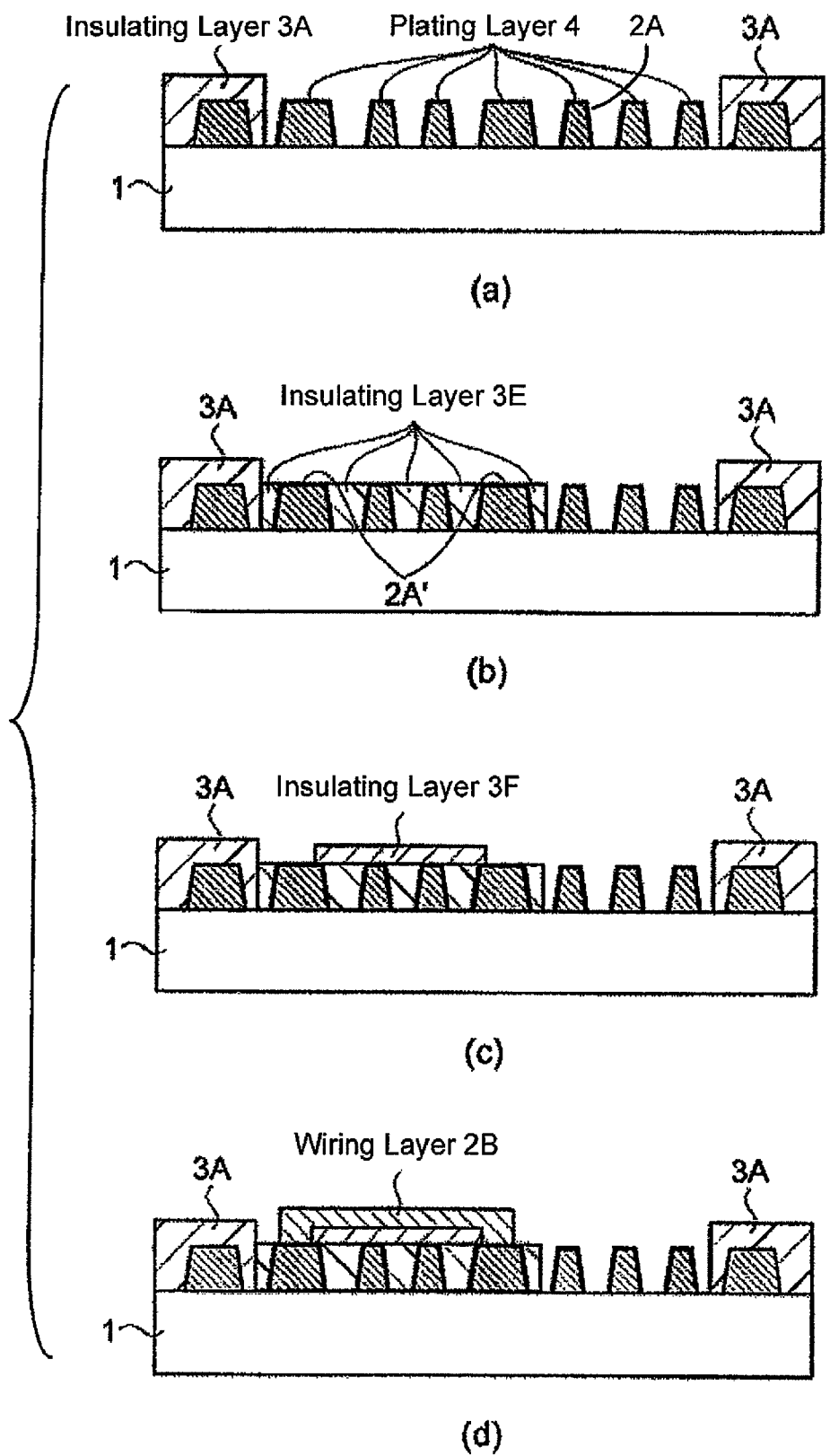
FIG. 3(*a*)-(*d*) are schematic cross-sectional views illustrating the method of manufacturing the wiring board according to the second embodiment of the present invention.

FIG. 3(a) shows a wiring layer 2A, an insulating layer 3A, and a plating layer 4 formed by the additive method, as in the case described in FIG. 1(b). An insulating layer 3E (first-tier insulating layer) is first formed by ink jetting in between the wiring layers 2A, as shown in FIG. 3(b). In this case, the insulating material is filled from the flexible substrate 1 up to the point where the upper surface of the insulating layer 3E is same level as the contact sections 2A' in order to form the insulating layer 3E. The wiring layer 2A acts as a dam for the insulating layer 3E. Therefore, the insulating material should be deposit in the prescribed amount necessary to fill in spaces between the wiring layers 2A. The insulating layer 3E does not cover the contact sections 2A'.

As shown in FIG. 3(c), an insulating layer 3F (second-tier insulating layer) is formed by ink jetting over the wiring layers 2A and the insulating layers 3E where a wiring layer 2B that is to be connected to the contact sections 2A' is supposed to be formed with the insulating layer 3F between the wiring layer 2A or the insulating layer 3E and the insulating layer 3F. In other words, the insulating layer 3F is deposited so as to be in between the wiring layer 2B that will be formed later and the wiring layers 2A and the insulating layers 3E that have been laid out already. The insulating layer 3F is formed only on the sides of the contact sections 2A' along the direction in which the wiring layer 2B is supposed to extend across the insulating layer 3E and the wiring layer 2A. Therefore, the insulating layer 3E does not form any concave insulating layer section encircling the contact sections 2A'. The insulating layers 3E and 3F are cured by heat treatment after being formed.

Next, the wiring layer 2B that connects with the contact sections 2A' is formed by ink jetting as shown in FIG. 3(d). The wiring layer 2B is formed along the insulating layer 3F. Since the wiring material is deposited along the edge of the insulating layer 3F, the wiring layer 2B does not need to be formed any wider than necessary to define the contact sections 2A'. The wiring layer 2B is baked by heating after being deposited. The insulating layer 3 and the layered wiring 2 can be similarly formed overlapping in multiple layers afterward.

The effects of the method according to the second embodiment explained above will now be described.

(1) The insulating layer 3F of the contact sections 2A' is formed only on the side along which the wiring layer 2B is formed, instead of being configured to encircle the concavity in which the contact sections 2A' is supposed to be formed. It is, accordingly, easier to control the formation of the insulating layer 3F by ink jetting.

Droplet Depositing Apparatus

Next, the droplet depositing apparatus for forming the layered wiring 2 and the insulating layer 3 by ink jetting on the surface of the flexible substrate 1 in the methods of the first and the second embodiments of the present invention will be described. The droplet depositing apparatus is an apparatus for depositing the liquid material as droplets.

Figure 4:
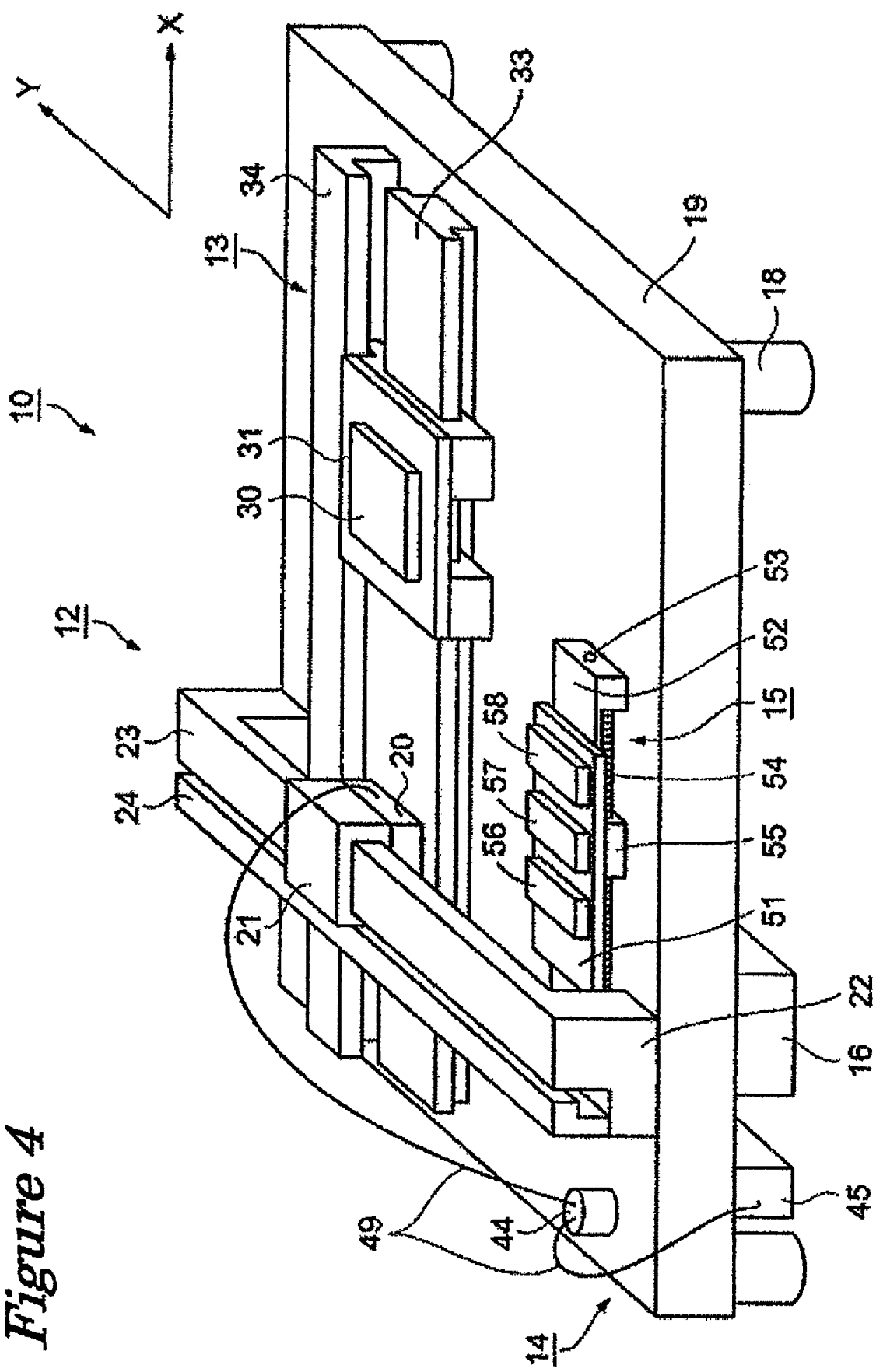
FIG. 4 is a perspective view of a droplet depositing apparatus to be used to perform the manufacturing method of the present invention.

As shown in FIG. 4, a droplet depositing apparatus 10 has a head mechanism 12 having a head unit 20 for ejecting as droplets the liquid material for forming the layered wiring 2 and insulating layer 3; a work mechanism 13 for mounting the flexible substrate 1 or another such work piece (shown as work 30 in FIG. 4), which is the object onto which the droplets are to be deposited from the head unit 20; a liquid material supply unit 14 for normally supplying liquid material for the droplets to the head unit 20; a maintenance mechanism 15 for maintaining the head unit 20; and a control unit 16 for collectively controlling these mechanisms and supply units.

The droplet depositing apparatus 10 has a plurality of supporting legs 18 provided at the bottom, and a surface plate 19 disposed on top of the supporting legs 18. The work mechanism 13 is disposed on top of the surface plate 19 so as to extend in the longitudinal direction (X-axis direction) of the surface plate 19. The head mechanism 12, which is supported by two supporting pillars 22 that are fixedly coupled to the surface plate 19, is disposed partially on top of the work mechanism 13 and extends in a direction orthogonal to the direction of the work mechanism 13 (Y-axis direction). The liquid material supply unit 14 for supplying the liquid material to the head unit 20 of the head mechanism 12 is disposed at one end of the surface plate 19. The maintenance mechanism 15 is disposed in the X-axis direction aligned with the work mechanism 13 near one of the supporting pillars 22 of the head mechanism 12. Furthermore, the control unit 16 is housed underneath the surface plate 19.

The head mechanism 12 has the head unit 20 for ejecting the liquid material, a head carriage 21 for suspending the head unit 20, a Y-axis guide 23 for guiding the movement of the head carriage 21 in the Y-axis direction, and a Y-axis linear motor 24 disposed parallel to the Y-axis guide 23 on the side of the Y-axis guide 23.

The work mechanism 13 is positioned partially underneath the head mechanism 12 and is disposed along the X-axis direction with a configuration substantially similar to the head mechanism 12. The work mechanism 13 has a work 30, a work mounting stage 31 on which the work 30 is mounted, an X-axis guide 33 for guiding the movement of the work mounting stage 31, and an X-axis linear motor 34 disposed parallel to the X-axis guide 33 on the side of the X-axis guide 33.

In this configuration, the head unit 20 and the work 30 can move freely back and forth in the Y-axis direction and the X-axis direction, respectively. First, the movement of the head unit 20 will be described. The head carriage 21 for suspending the head unit 20 is movably mounted on the Y-axis guide 23. Though not shown in the diagrams, there is a protrusion that extends from the head carriage 21 to the side of the Y-axis linear motor 24 that engages the Y-axis linear motor 24 to obtain a drive force, whereby the head carriage 21 can be moved along the Y-axis guide 23 to any desired position. Similarly, the work 30 mounted on the work mounting stage 31 can be moved freely in the X-axis direction.

Thus, the head unit 20 is configured to move to the ejecting position in the Y-axis direction, stops there, synchronize with the X-axis directional movement of the work 30 underneath, and eject the droplets. A pattern or the like of the layered wiring 2 can be drawn on the work 30 by controlling the movement of the work 30 in the X-axis direction relative to the movement of the head unit 20 in the Y-axis direction.

The liquid material supply unit 14 for supplying the liquid material to the head unit 20 has a liquid material tank 45, a liquid material pump 44, and a flow duct tube 49 for connecting the liquid material tank 45 to the head unit 20 via the liquid material pump 44. A plurality of liquid material tanks 45 can also be provided instead of only one. In this case, each of the plurality of tanks is connected to the head unit 20 through its own flow duct tube and liquid material pump. In this manner, liquid materials with different functions can thereby be supplied to the head unit 20.

Figure 5:
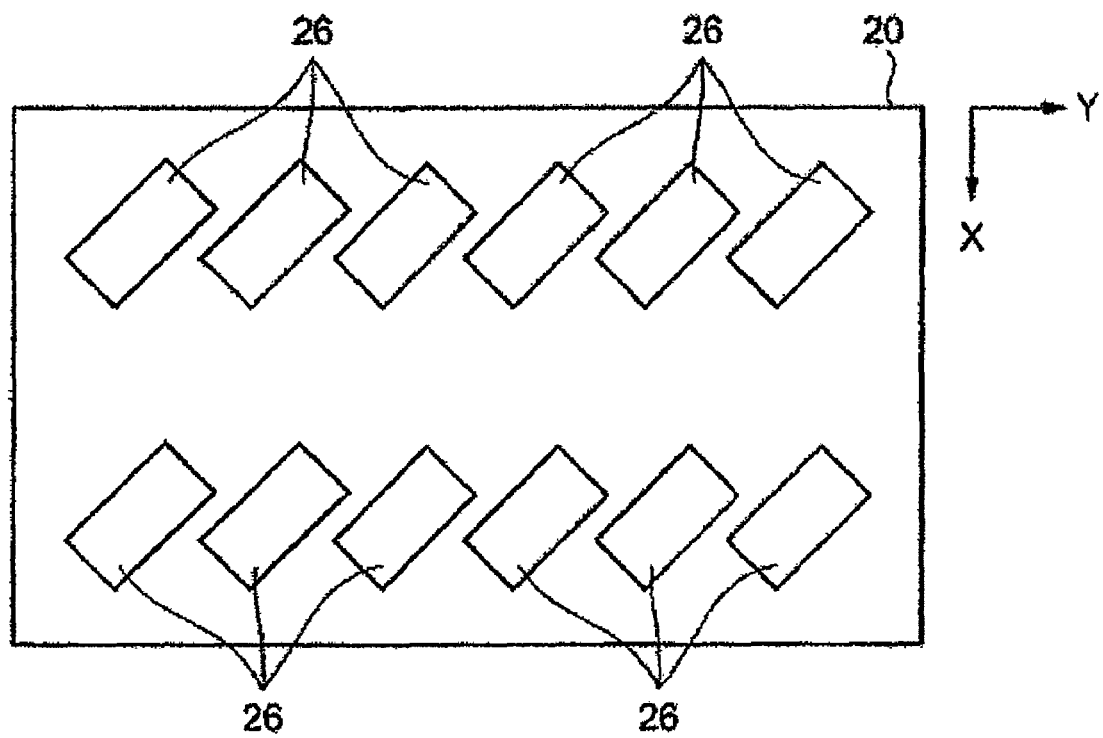
FIGS. 5(*a*) and (*b*) are plan views of a head unit and an ejection head of the droplet depositing apparatus shown in FIG. 4.
Figure 5:
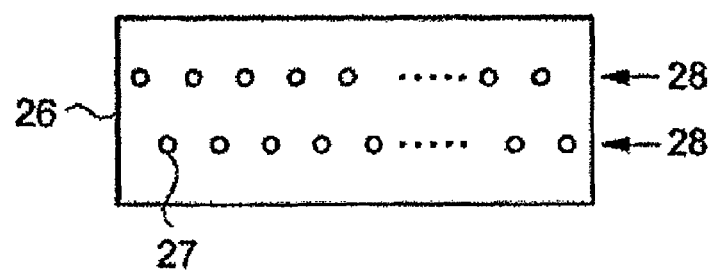

The head unit 20 holds six identically configured ejection heads 26, as shown in FIG. 5(a). FIG. 5(a) is a diagram of the head unit 20 as observed from the side with the work mounting stage 31. Also, each of the ejection heads 26 for ejecting the liquid material has two nozzle rows 28, both extending in the longitudinal direction of the ejection heads 26, as shown in FIG. 5(b). In this embodiment, one nozzle row has 180 nozzles 27 are aligned in a row. When a plurality of different liquid materials are used, the liquid materials to be ejected can be separately assigned to the six ejection heads 26.

Figure 6:
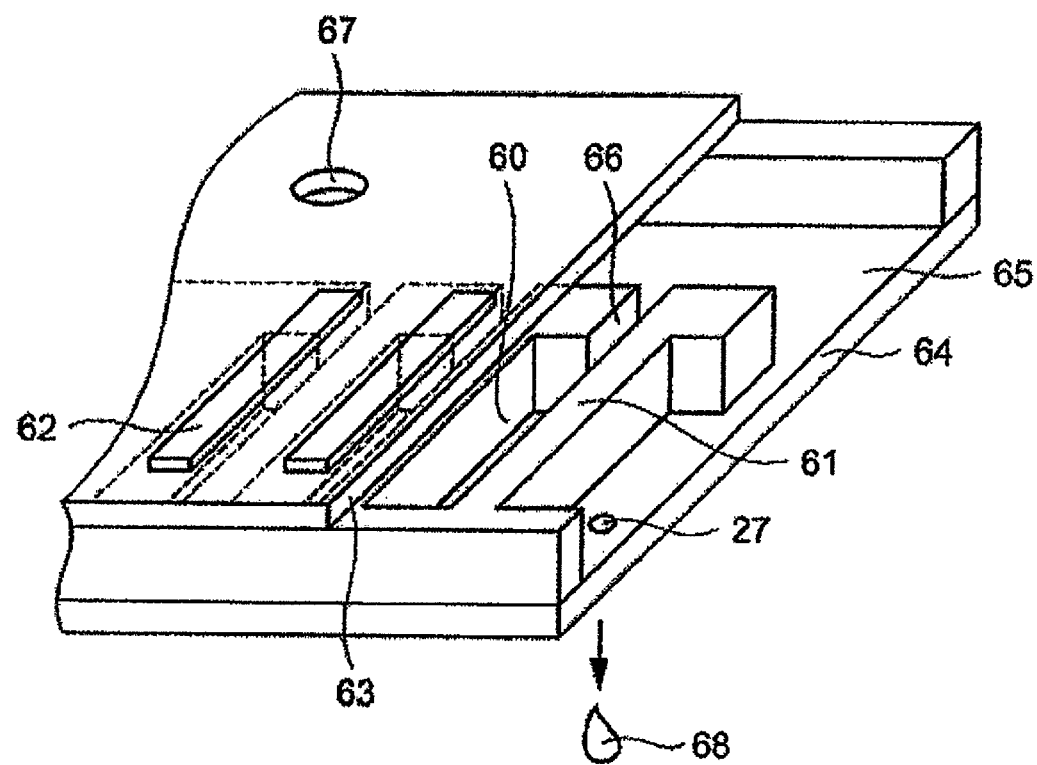
FIGS. 6(*a*) and (*b*) are a partial perspective view and a partial cross sectional view of a nozzle of the droplet depositing apparatus shown in FIG. 4.
Figure 6:
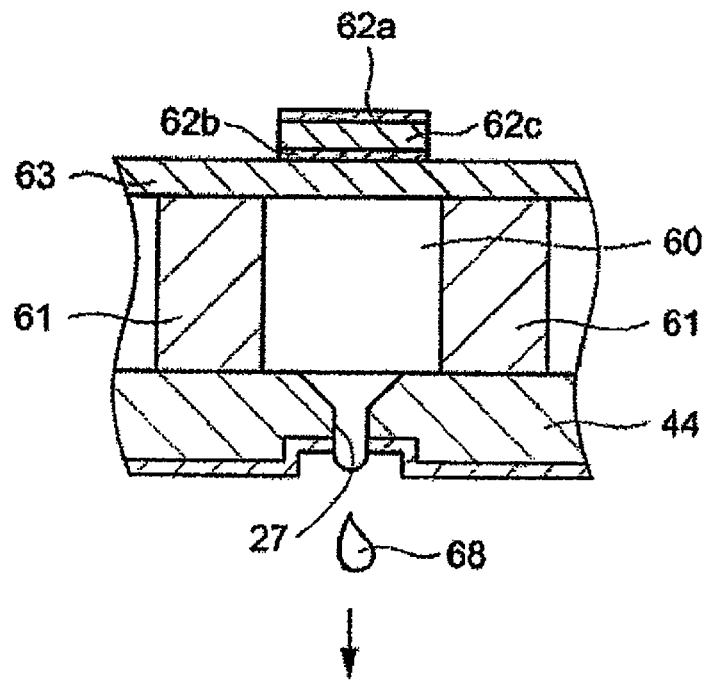

The ejection heads 26 each have a vibrating plate 63 and a nozzle plate 64, as shown in FIGS. 6(a) and (b). A liquid collector 65 normally filled with the liquid material supplied from the liquid material tank 45 via a hole 67 is located between the vibrating plate 63 and the nozzle plate 64. A plurality of barrier walls 61 are also located between the vibrating plate 63 and the nozzle plate 64. The sections enclosed by the vibrating plate 63, the nozzle plate 64, and a pair of barrier walls 61 constitute cavities 60. Since the cavities 60 are provided so as to correspond to the nozzles 27, the number of cavities 60 and the number of nozzles 27 are the same. The liquid material is supplied from the liquid collector 65 to the cavities 60 via supply ports 66 positioned between each pair of barrier walls 61.

A piezoelement 62c and a pair of electrodes 62a and 62b on either side of the piezoelement 62c are disposed so as to correspond to each cavity 60 on the vibrating plate 63. A drive voltage is applied to the pair of electrodes 62a and 62b, whereby liquid material is formed into droplets 68 and ejected from the corresponding nozzle 27. An electro-thermal converting element may be used instead of the vibrating element 62 in order to eject the liquid material. Such configuration is designed to eject the liquid material by utilizing the thermal expansion of the liquid material through the activation of the electrothermal converting element.

The maintenance mechanism 15 has the following maintenance units: a capping unit 56, a wiping unit 57, and a flushing unit 58, as shown in FIG. 4. The maintenance mechanism 15 further has a maintenance carriage 51 for mounting the maintenance units, a maintenance carriage guide 52 for guiding the movement of the maintenance carriage 51, a threaded part 55 integrally formed with the maintenance carriage 51, a ball screw 54 with which the threaded part 55 is threadably engaged, and a maintenance motor 53 for rotating the ball screw 54. Thereby, when the maintenance motor 53 is activated in the forward or backward direction, the ball screw 54 rotates and the maintenance carriage 51 moves in the corresponding direction along the X-axis direction via the threaded part 55. When the maintenance carriage 51 moves to perform maintenance on the head unit 20, the head unit 20 moves along the Y-axis guide 23 and stops directly above the maintenance units.

The capping unit 56 of the maintenance units seals and caps all 12 of the ejection heads 26 in the head unit 20 when the droplet depositing apparatus 10 is not operating, thereby ensuring that the liquid material does not dry to clog the nozzles 27 or cause other such problems. The wiping unit 57 wipes off the liquid material and other matter adhered to the nozzles 27 after continuous liquid material ejection or at the time capping with a wiping cloth containing a cleaning solution, and maintains all the nozzles 27 in a clean condition. The flushing unit 58 receives the liquid material ejected from the nozzles 27 before the droplet depositing apparatus 10 begins operating or the work 30 is processed, and confirms the ejection state of each of the nozzles 27.

The state of the ejection heads 26 can be maintained by these maintenance units to ensure satisfactory ejection conditions when the droplet depositing apparatus 10 is not operating or during standby when the mounted work 30 is being replaced.

Figure 7:
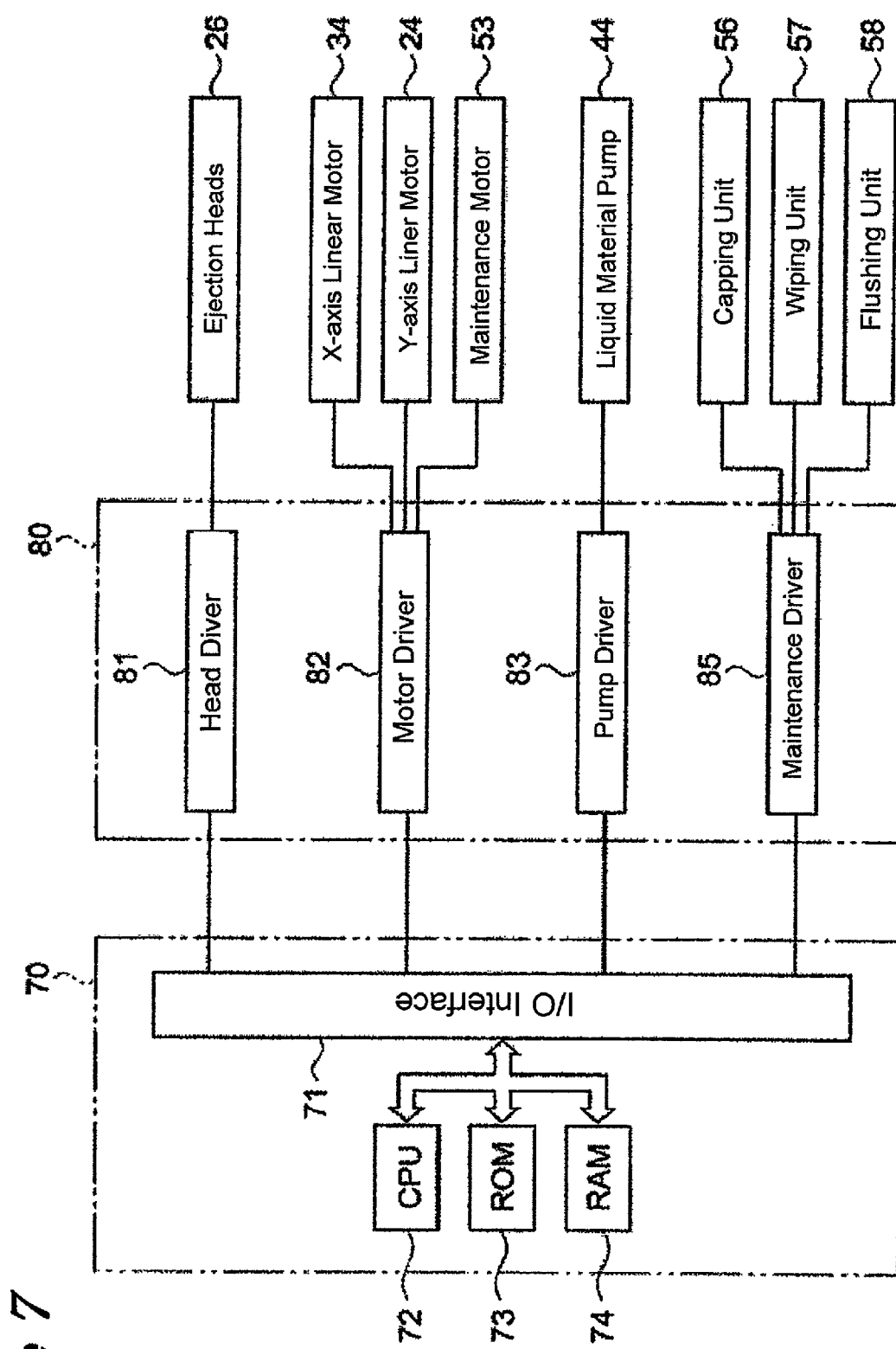
FIG. 7 is a block view showing the configuration of the control unit of the droplet depositing apparatus shown in FIG. 4.

Next, the control unit 16 for controlling the configuration described above will be described with reference to FIG. 7. The control unit 16 has an instruction unit 70 and a drive unit 80. The instruction unit 70 includes a CPU 72, ROM 73, RAM 74, and an input/output interface 71, wherein the CPU 72 processes various signals inputted and outputted from and to the input/output interface 71 based on data in the ROM 73 and RAM 74, and outputs a control signal to the drive unit 80 via the input/output interface 71.

The drive unit 80 includes a head driver 81, a motor driver 82, a pump driver 83, and a maintenance driver 85. The motor driver 82 controls the X-axis linear motor 34 and the Y-axis linear motor 24, and accordingly controls the movement of the work 30 and the head unit 20 with a control signal from the instruction unit 70. Furthermore, the motor driver 82 controls the maintenance motor 53 to move the necessary units of the maintenance mechanism 15 to the maintenance positions. The head driver 81 controls the ejection of liquid material from the ejection heads 26, such that a predetermined image is drawn on the work 30 by controlling in synchronization with the controlling of the motor driver 82. The pump driver 83 controls the liquid material pump 44 according to the ejection state of the liquid material, and optimally controls the supply of liquid material to the ejection heads 26. The maintenance driver 85 controls the capping unit 56, the wiping unit 57, and the flushing unit 58 of the maintenance mechanism 15, and ensures that a satisfactory state is constantly maintained in the nozzles 27 of the ejection heads 26.

The instruction unit 70 is configured to send signals independently to the plurality of vibrating elements 62 via the head driver 81. Therefore, the volume of the droplets 68 to be ejected from the nozzles 27 can be controlled and varied for each nozzle 27 using the signals that are sent from the head driver 81 to each of the nozzles 27.

Manufacturing Apparatus

Figure 8:
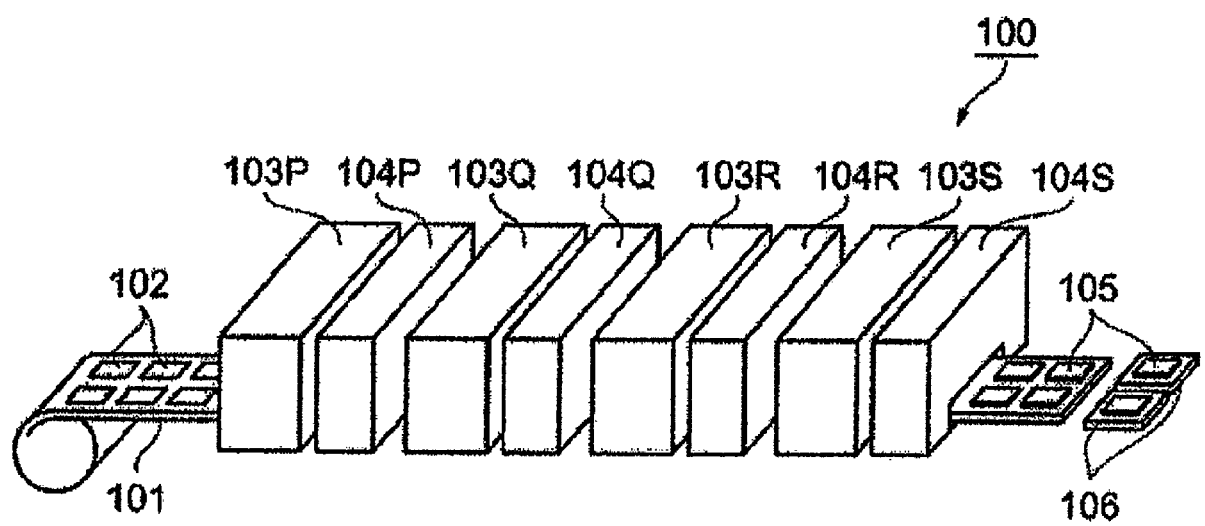
FIG. 8 is a schematic view of the manufacturing apparatus for the wiring board to be used to perform the manufacturing method of the present invention.

The manufacturing apparatus that can efficiently manufacture the wiring board 6 will now be described. The manufacturing apparatus 100 of the wiring board 6 shown in FIG. 8 is a group of apparatuses that include a depositing apparatuses that deposits a conductive material for forming the layered wiring 2 and an insulating material for forming the insulating layer 3. The depositing device is the droplet depositing apparatus 10.

The manufacturing apparatus 100 has: a depositing device 103P for forming the insulating layer 3B, an oven 104P for heating and curing the insulating layer 3B, a depositing device 103Q for forming the wiring layer 2B, an oven 104Q for heating and baking the wiring layer 2B, a depositing device 103R for forming the insulating layer 3C, an oven 104R for heating and curing the insulating layer 3C, a depositing device 103S for forming the wiring layer 2C, and an oven 104S for heating and baking the wiring layer 2C, which are arranged in this order.

The manufacturing apparatus 100 unrolls a flexible substrate sheet 101 that has been rolled up, and conveys the sheet to the feed port of the manufacturing apparatus 100. The flexible substrate sheet 101 is an example of the rectangular flexible substrate 1. A high-density wiring section 102, which corresponds to the wiring layer 2A, the insulating layer 3A, and the plating layer 4, is formed on the surface of the flexible substrate sheet 101. The manufacturing apparatus 100 forms an insulating layer 3B with the depositing device 103P in an overlapped fashion on the conveyed wiring section 102. After the insulating layer 3B is deposited, the manufacturing apparatus 100 conveys the wiring section 102 to the oven 104P, where the insulating layer 3B is heated and cured. Then, the manufacturing apparatus 100 conveys the wiring section 102 to the depositing device 103Q to deposit the wiring layer 2B, and after the wiring layer 2B is deposited, the wiring layer 2B is heated and baked in the oven 104Q. Similarly, the insulating layer 3C is deposited and then heated and cured by the depositing device 103R and the oven 104R, and the wiring layer 2C is deposited and then heated and baked by the depositing device 103S and the oven 104S. In this manner, a multilayered wiring section 105 with a layered wiring 2 that has multiple layers such as is shown in FIG. 2(f) can be formed on the surface of the flexible substrate sheet 101. Then, the flexible substrate sheet 101 is cut and used as a flexible multilayered wiring board 106.

Before the flexible substrate sheet 101 is cut out, the flexible multilayered wiring board 106 is obtained as a wiring board 6 by mounting the electronic components 5 as shown in FIG. 2(g). The manufacturing apparatus 100 can also include an installation apparatus for the electronic components 5 and a cutting apparatus for the flexible substrate sheet 101.

Third Embodiment

Figure 9:
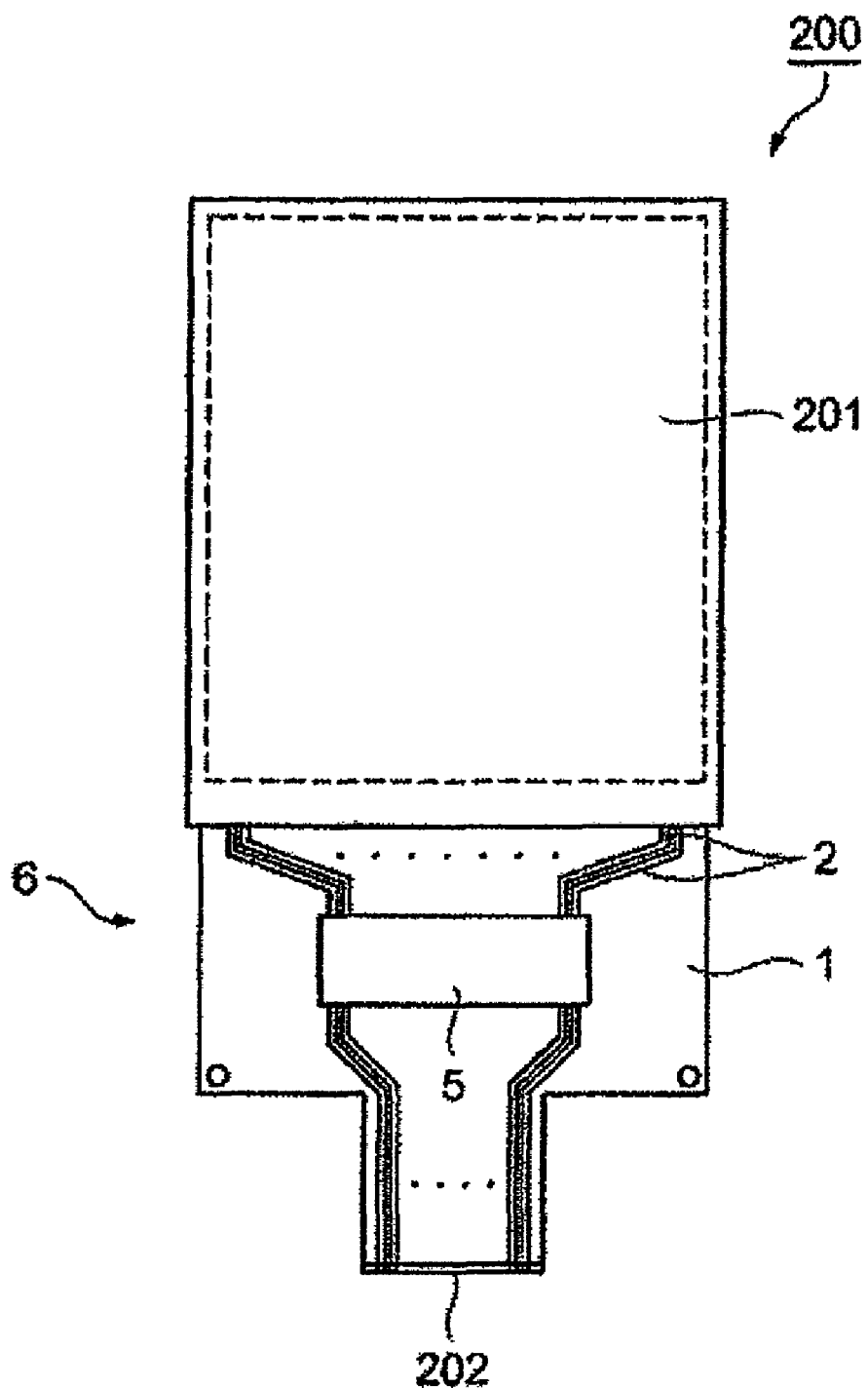
FIG. 9 is a plan view of a liquid crystal display device including the wiring board of the present invention.

Next, an embodiment of an electro-optical device having the wiring board 6 of the present invention will be described. FIG. 9 is a plan view of a liquid crystal display device 200, which is an electro-optical device having the wiring board 6. The liquid crystal display device 200 is incorporated into a portable phone or another such electronic device, and is used as a display section. The liquid crystal display device 200 has a liquid crystal panel 201 for displaying various images, and a wiring board 6 provided with a panel control unit for controlling the liquid crystal panel 201. The wiring board 6 has a flexible substrate 1, a terminal 202 for connecting the flexible substrate 1 with an external device, a liquid crystal driver or another such electronic component 5 constituting the panel control unit, and a layered wiring 2 for connecting the electronic component 5 with the terminal 202.

The liquid crystal display device 200 displays the information inputted from the terminal 202 on the liquid crystal panel 201 via the electronic component 5. The multilayered layered wiring 2 is formed on the flexible substrate 1 that is provided with the terminal 202 and the electronic component 5. Therefore, the planar dimensions of the space needed to accommodate the components can be reduced as compared with a wiring layer configuration that is formed from a single layer. Also, a pliable flexible substrate 1 can be incorporated into portable phones and the like with a configuration that extends along a curved surface, and can thus be used in a wide range of applications.

Figure 10:
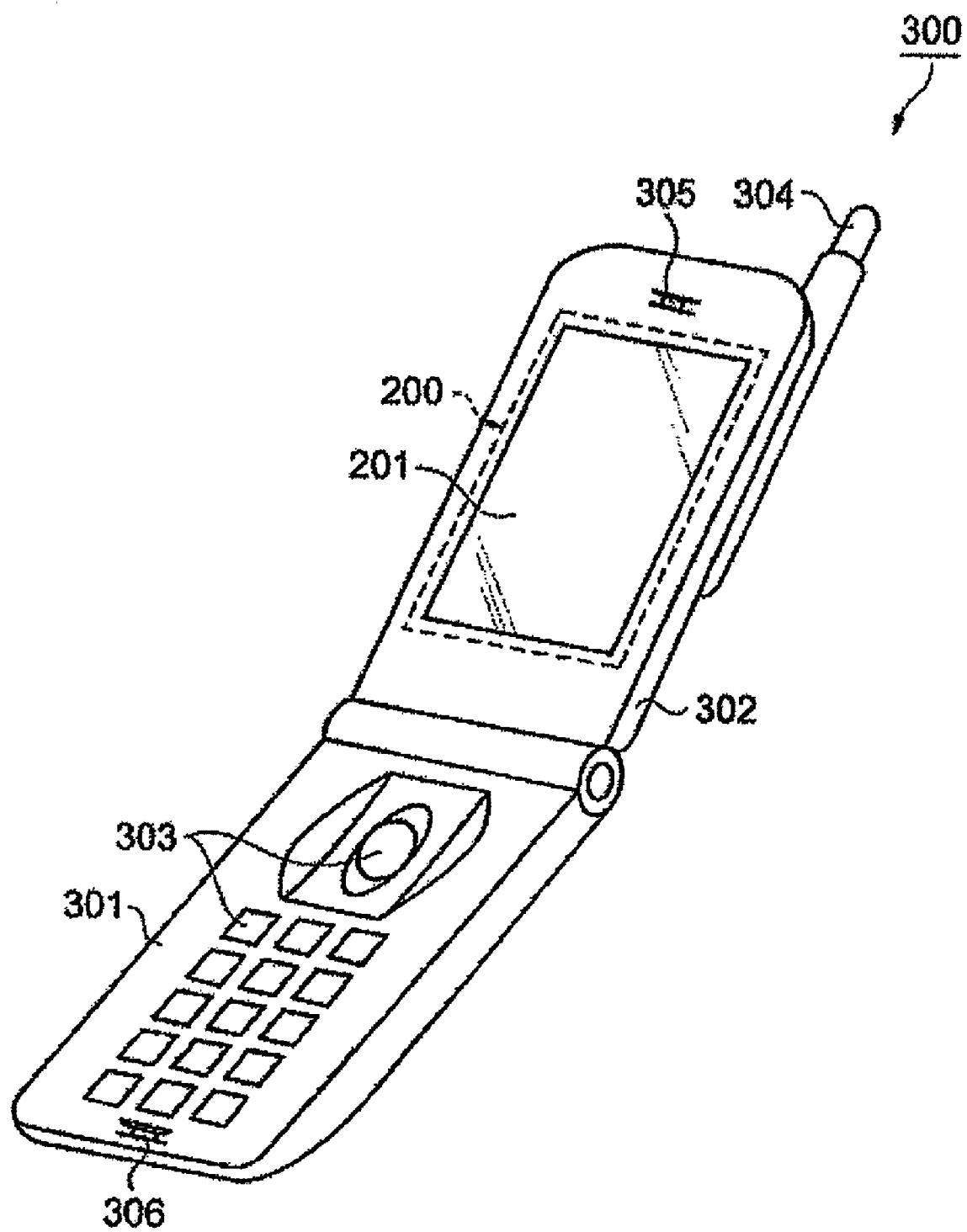
FIG. 10 is an external view of a portable phone provided with a liquid crystal display device having the wiring board of the present invention.

FIG. 10 is an external view of a portable phone, which is an example of an electronic device provided with the liquid crystal display device 200 shown in FIG. 9. The portable phone 300 shown herein has a main body 301, and a display section 302 provided to be capable of opening and closing. Operating buttons 303 are provided in alignment on the front of the main body 301. An antenna 304 is mounted to be extendable from one end of the display section 302. A speaker is disposed inside the receiver 305, and a microphone is mounted inside the transmitter 306.

The liquid crystal display device 200 is disposed on the display section 302 along with the flexible substrate 1. Various images pertaining to phone communication can be displayed on the liquid crystal panel 201. The flexible substrate 1 provided with the electronic component 5 functions as part of a portable control unit for controlling the entire portable phone. Also, the flexible substrate 1 having the multilayered wiring layer makes it possible to reduce the size of the substrate, and allows the size of the portable phone 300 to be reduced.

The wiring board 6 of the present invention can also be applied to an electro-optical device other than the liquid crystal display device 200, such as a plasma display device, an electroluminescence display device, an FED (Field Emission Display) with an electron emission element, an SED (Surface-Conduction Electron-Emitter Display), or the like.

Furthermore, aside from portable phones, the liquid crystal display device 200 can also be mounted in various other electronic devices that have display units. Specific examples include electronic dictionaries, portable game devices, calculators, wristwatches, small televisions, personal computers, navigations systems, POS terminals, and the like.

The present invention is not limited to the embodiments described above, and the following modifications are provided as additional examples.

(1) As the liquid conductive material, metallic particles other than Ag particles can also be used. For example, any one of the following, or an alloy of any combination of two or more of the following may be used: gold, platinum, copper, palladium, rhodium, osmium, ruthenium, iridium, iron, tin, zinc, cobalt, nickel, chrome, titanium, tantalum, tungsten, and indium. However, Ag can be reduced at relatively low temperatures and is therefore easily handled. Thus, as far as this aspect is concerned, it is preferable to use a conductive material containing Ag particles when utilizing inkjet methods.

(2) The insulating material can be, other than epoxy resins, any material that can maintain electrical insulation, such as one selected from: polyimide resins, polyester resins, phenol resins, fluorine resins, ultraviolet curing resins, visible light curing resins, and the like.

(3) Other than polyimide, the flexible substrate 1 can be made using synthetic resins such as an epoxy resin, a polyester resin, a phenol resin, or a fluorine resin as a base material; or can be a composite base material made of a combination of these base materials.

(4) The flexible substrate 1 can be made of a nonflexible material, which may be glass or ceramic systems. The layered wiring 2 and the insulating layer 3 can still be formed with the manufacturing apparatus 100 even when the substrate 1 is nonflexible.

(5) Although the wiring layer 2A is made of Cu and the wiring layers 2B and 2C are made of silver in the above-mentioned embodiments, the same material may be used for the wiring layer 2A formed by an additive method and for the wiring layers 2B and 2C formed by ink jetting. In this case, the plating layer 4 is not needed.

The wiring board 6 of the present invention can be mounted in various display devices and also in various electronic devices other than display devices, and can allow the size of the electronic device having the wiring board 6 and its manufacturing costs to be reduced.

The wiring board manufactured by the inkjet method has a wiring layer formed into multiple layers, and can be mounted in a liquid crystal display device or another such electro-optical device. The manufacturing method allows the number of steps and the amount of material used by the inkjet method to be reduced, and is capable of resulting in a shorter delivery date and reduced costs. Also, due to the multilayer structure, the wiring board can have reduced planar dimensions. Accordingly, the resulting liquid crystal display device or another such electro-optical device can be mounted in a wide variety of electronic devices such as portable phones.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method of manufacturing a wiring board, comprising steps of:
    providing a substrate;
    forming a first wiring layer on the substrate by photolithography;
    forming a first insulating layer by ink jetting so as to cover a part of the first wiring layer and expose an exposed section of the first wiring layer;
    forming a second wiring layer by ink jetting partly over the first wiring layer, with the first insulating layer being between the part of the first wiring layer and a part of the second wiring layer;
    forming a second insulating layer by ink jetting so as to cover at least a part of the second wiring layer and expose an exposed section of the second wiring layer; and
    forming a third wiring layer by ink jetting partly over the second wiring layer, with the second insulating layer being between the part of the second wiring layer and a part of the third wiring layer,
    the step of forming the first insulating layer including steps of
        forming a first-tier insulating layer by ink jetting so that an upper surface of the first-tier insulating layer is on the same level with an upper surface of the first wiring layer, and
        forming a second-tier insulating layer by ink jetting so as to cover at least a part of the first wiring layer and the first-tier insulating layer, so that the second-tier insulating layer is between the second wiring layer and the first wiring layer or the first-tier insulating layer.

2. The method of manufacturing a wiring board according to claim 1, wherein
    in the step of forming the first insulating layer, the exposed section is formed by depositing an insulating material so as to avoid the exposed section, encircling the exposed section with the first insulating layer.

3. The method of manufacturing a wiring board according to claim 1, wherein
    in the step of forming the third wiring layer, the second and the third wiring layers are respectively connected to the exposed sections of the first and the second wiring layers and made electrically conductive therewith.

4. The method of manufacturing a wiring board according to claim 1, further comprising a step of:
    mounting an electronic component on at least one of the exposed sections of the first, second, and the third wiring layers.

5. A method of manufacturing a wiring board, comprising steps of:
    providing a substrate;
    forming a first wiring layer on the substrate by photolithography;
    forming a first insulating layer by ink jetting so as to cover a part of the first wiring layer and expose an exposed section of the first wiring layer; and
    forming a second wiring layer by ink jetting partly over the first wiring layer, with the first insulating layer being between the part of the first wiring layer and a part of the second wiring layer,
    the step of forming the first insulating layer including steps of
        forming a first-tier insulating layer by ink jetting so that an upper surface of the first-tier insulating layer is on the same level with an upper surface of the first wiring layer, and
        forming a second-tier insulating layer by ink jetting so as to cover at least a part of the first wiring layer and the first-tier insulating layer, so that the second-tier insulating layer is between the second wiring layer and the first wiring layer or the first-tier insulating layer,
    in the step of forming the second-tier insulating layer, the second-tier insulating layer being formed only on sides of the exposed section along which the second wiring layer extends across the first-tier insulating layer and the first wiring layer.

* * * * *